United States Patent
Maute

(10) Patent No.: US 10,224,356 B2
(45) Date of Patent: Mar. 5, 2019

(54) OPTOELECTRONIC SEMICONDUCTOR COMPONENT AND METHOD FOR PRODUCING AN OPTOELECTRONIC SEMICONDUCTOR COMPONENT

(71) Applicant: OSRAM Opto Semiconductors GmbH, Regensburg (DE)

(72) Inventor: Markus Maute, Alteglofsheim (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/573,414

(22) PCT Filed: May 9, 2016

(86) PCT No.: PCT/EP2016/060335
§ 371 (c)(1),
(2) Date: Nov. 10, 2017

(87) PCT Pub. No.: WO2016/180780
PCT Pub. Date: Nov. 17, 2016

(65) Prior Publication Data
US 2018/0108695 A1 Apr. 19, 2018

(30) Foreign Application Priority Data
May 13, 2015 (DE) .......................... 10 2015 107 591

(51) Int. Cl.
*H01L 27/146* (2006.01)
*H01L 33/48* (2010.01)
(Continued)

(52) U.S. Cl.
CPC .......... *H01L 27/14625* (2013.01); *F21V 5/04* (2013.01); *H01L 25/0753* (2013.01);
(Continued)

(58) Field of Classification Search
CPC ............. H01L 27/14625; H01L 33/465; H01L 25/0753; H01L 33/387; H01L 33/405;
(Continued)

(56) References Cited

U.S. PATENT DOCUMENTS

2005/0211998 A1 9/2005 Daniels et al.
2010/0213485 A1* 8/2010 McKenzie .............. H01L 33/20
257/98
2014/0159067 A1 6/2014 Sakariya et al.

FOREIGN PATENT DOCUMENTS

DE 112013005899 T5 9/2015
WO 2004073075 A1 8/2004

* cited by examiner

*Primary Examiner* — Selim U Ahmed
(74) *Attorney, Agent, or Firm* — McDermott Will & Emery LLP

(57) ABSTRACT

The invention relates to an optoelectronic semiconductor component (100) comprising the following —an optoelectronic semiconductor chip (2), the lateral surfaces (2c) and lower face (2b) of which are at least partly covered by a molded body (3) that is electrically conductive and is designed to electrically contact the optoelectronic semiconductor chip (2), —at least one via (6) which comprises an electrically conductive material and is laterally spaced from the semiconductor chip (2), said via (6) completely passing through the molded body (3), wherein the via (6) extends from an upper face (3a) of the molded body (3) to a lower face (3b) of the molded body (3), —at least one insulating element (9) which is arranged within the molded body (3) between the via (6) and the semiconductor chip (2) and extends from the upper face (3a) of the molded body (3) to the lower face (3b) of the molded body (3), and —an electrically conductive connection (7) which is connected to the semiconductor chip (2) and the via (6) in an electrically conductive manner.

15 Claims, 4 Drawing Sheets

Figure 1:
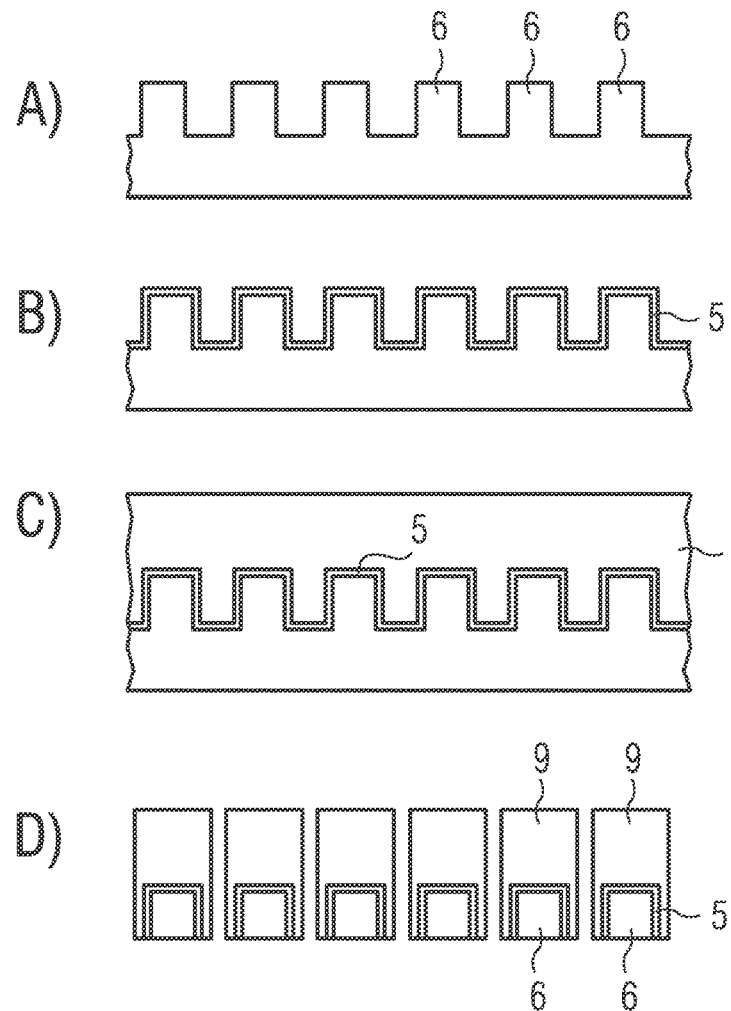

(51) Int. Cl.
*H01L 33/62* (2010.01)
*F21V 5/04* (2006.01)
*H01L 25/075* (2006.01)
*H01L 33/22* (2010.01)
*H01L 33/38* (2010.01)
*H01L 33/40* (2010.01)
*H01L 33/46* (2010.01)
*H01L 33/56* (2010.01)

(52) U.S. Cl.
CPC ............ *H01L 33/22* (2013.01); *H01L 33/387* (2013.01); *H01L 33/405* (2013.01); *H01L 33/465* (2013.01); *H01L 33/486* (2013.01); *H01L 33/62* (2013.01); *H01L 33/56* (2013.01)

(58) Field of Classification Search
CPC ....... H01L 33/22; H01L 33/486; H01L 33/62; H01L 33/56; F21V 5/04
See application file for complete search history.

OPTOELECTRONIC SEMICONDUCTOR COMPONENT AND METHOD FOR PRODUCING AN OPTOELECTRONIC SEMICONDUCTOR COMPONENT

The invention relates to an optoelectronic semiconductor component. Furthermore, the invention relates to a method for producing an optoelectronic semiconductor component.

Optoelectronic semiconductor components may comprise semiconductor chips, which can be embedded in a molded body. In the process flow, the molded body must be ground to the typical thickness of a semiconductor chip in order to be able to expose and contact the rear side of the semiconductor chips. This results in a small thickness of the semiconductor chip and/or of the optoelectronic semiconductor component of 100 µm to 120 µm, for example. This small thickness leads to difficulties in the handling and later singulation of the optoelectronic semiconductor chips. Moreover, these optoelectronic semiconductor chips and/or optoelectronic semiconductor components can easily break due to their low thickness.

One object of the invention is to provide a mechanically stable semiconductor component. In particular, it is an object of the invention is to provide an optoelectronic semiconductor component which is break-resistant.

These objects are achieved by an optoelectronic semiconductor component according to the independent claim 1. Advantageous configurations and developments of the invention are the subject-matter of the dependent claims. Furthermore, these objects are achieved by a method for producing an optoelectronic semiconductor component according to the independent claim 13. Advantageous configurations and developments of the method are the subject-matter of the dependent claims 14 and 15.

In at least one embodiment, the optoelectronic semiconductor component includes at least one optoelectronic semiconductor chip, in particular exactly one optoelectronic semiconductor chip. The optoelectronic semiconductor chip comprises side surfaces and a bottom side. These side surfaces and the bottom side are at least partially covered by a molded body. The molded body is electrically conductive and adapted to electrically contact the optoelectronic semiconductor chip. The optoelectronic semiconductor component comprises at least one VIA. The VIA comprises or includes an electrically conductive material. The VIA is arranged to be laterally spaced from the semiconductor chip. The VIA reaches completely through the molded body, wherein the VIA extends from an upper side of the molded body and to a bottom side of the molded body. The optoelectronic semiconductor component includes an insulation element. The insulation element is arranged between the VIA and the semiconductor chip, in particular within the molded body. The insulation element extends from the upper side of the molded body to the lower side of the molded body. In particular, the insulation element prevents a direct current flow between the semiconductor chip and the VIA. The optoelectronic semiconductor component comprises an electrically conductive connection. The electrically conductive connection is electrically-conductively connected to the semiconductor chip and the VIA.

According to at least one embodiment, the optoelectronic semiconductor chip includes a semiconductor layer sequence. The semiconductor layer sequence of the semiconductor chip is preferably based on a III-V compound semiconductor material. Preferably, the semiconductor material can be based on a nitride compound semiconductor material. In the present case, the expression "based on a nitride compound semiconductor material" means that the semiconductor layer sequence or at least one layer thereof includes a III nitride compound semiconductor material, preferably $In_xAl_yGa_{1-x-y}N$, with $0 \leq x \leq 1$, $0 \leq y \leq 1$ and $x+y \leq 1$. In this case, this material does not necessarily have to comprise an exact mathematical composition of the above formula. Rather, it may comprise one or more dopants as well as additional constituents that do not substantially alter the characteristic physical properties of the $In_xAl_yGa_{1-x-y}N$ material. However, for the sake of simplicity, the above formula includes only the essential components of the crystal lattice (In, Al, Ga, N), even if these components may partially be replaced by small amounts of further substances.

The semiconductor layer sequence includes an active layer with at least one p-n junction and/or with one or multiple quantum well structures. During operation of the semiconductor chip, electromagnetic radiation is generated in the active region. A wavelength of the radiation is preferably in the ultraviolet and/or visible spectral range, in particular in wavelengths between 420 nm and 680 nm inclusive, e.g. between 440 nm and 480 nm inclusive.

According to at least one embodiment, the semiconductor chip is a light emitting diode, LED for short. In particular, the semiconductor chip is a thin film LED. Preferably, the semiconductor chip is adapted to emit blue light then. In particular, the semiconductor component is configured to emit blue light, red light, green light and/or white light.

According to at least one embodiment, the optoelectronic semiconductor chip includes a substrate. In particular, the substrate may be a silicon substrate, a germanium substrate or a sapphire substrate. As an alternative, the substrate can comprise SiC or GaN, for example.

According to at least one embodiment, the semiconductor layer sequence is arranged in the substrate, in particular in direct mechanic contact. The semiconductor layer sequence can be arranged over the entire surface on substrate.

As used hereinafter, the fact that a layer or an element is arranged or applied "on (to)" or "above" another layer or another element can mean that a layer or an element is arranged directly in direct mechanical and/or electrical contact on the other layer or the other element. Furthermore, it can also mean that a layer or an element is arranged on (to) or above the other layer or the other element. In this case, further layer and/or elements can be arranged between one and the other layer or between one and the other element.

According to at least one embodiment, the optoelectronic semiconductor chip comprises at least one main radiation side. In particular, the main radiation side is oriented perpendicular to a growth direction of the semiconductor layer sequence of the semiconductor chip. In particular, the main radiation side forms the upper side of the semiconductor chip. In particular, the radiation generated in the active layer is emitted via the main radiation side. The semiconductor chip comprises side surfaces and a lower side. In particular, the side surfaces are arranged perpendicular to the main radiation side. In particular, the lower side is the side of the semiconductor chip opposite the main radiation side.

According to at least one embodiment, the optoelectronic semiconductor chip includes a first contact layer, e.g. configured as an n contact, and a second contact layer, e.g. formed as a p contact. In particular, the first contact layer is arranged below the substrate of the semiconductor chip, in particular in direct mechanical contact. The second contact layer can be arranged on the substrate. In particular, the contact layers are adapted to electrically contact the semiconductor chip.

According to at least one embodiment, the optoelectronic semiconductor component comprises a molded body. The molded body at least partially covers the optoelectronic semiconductor chip, in particular the side surfaces thereof and the lower side of the semiconductor chip. In particular, the molded body covers the lower side of the semiconductor chip completely and/or the side surfaces at least partially. In this case, the expression "at least partially" can mean that at least the side surfaces of the substrate and/or the side surfaces of the first contact layer are completely covered by the molded body, wherein the side surfaces of the semiconductor layer sequence are free of the molded body.

According to at least one embodiment, the molded body completely covers the side surfaces and the lower surfaces of the semiconductor chip. In other words, the semiconductor chip is embedded in the molded body, so that only the main radiation side of the semiconductor chip is free of the molded body.

According to at least one embodiment, the molded body is electrically conductive. In particular, the molded body is additionally thermally conductive. As a result, a molded body can be provided, which has both electric and thermal conductivity. Thus, the molded body can be used to electrically contact the optoelectronic semiconductor chip on the one hand, and to dissipate heat from the semiconductor chip on the other hand.

According to at least one embodiment, the molded body is formed from a conductive polymer. As used herein, a conductive polymer is understood to be a chemical substance with constitutional repetition units and repeating units, which has electrically conductive and/or thermally conductive properties.

According to at least one embodiment, the conductive polymer is selected from a group including polypyrrole, polythiophene and polyaniline.

According to at least one embodiment, the conductive polymer is free of thermoplastic properties. As used herein, this means that the conductive polymer can not be deformed in a certain temperature range. The deformation particularly is a reversible deformation, which means that the deformation by cooling and re-heating can be repeated any number of times as long as no overheating of the conductive polymer occurs.

According to at least one embodiment, the molded body has a uniform thickness below the semiconductor chip. The thickness is at least 150 µm, 170 µm, 180 µm, 190 µm or 200 µm. As an alternative or in addition, the maximum thickness is 7 mm, 6 mm, 5 mm, 4 mm, 3 mm, 2 mm, 1000 µm, 800 µm, or 700 µm. The molded body is particularly configured to generate a current flow at least below the semiconductor chip. In other words, the conductive molded body serves as an electric contact for the semiconductor chip. In particular, the molded body enables a current flow between a further contact point, which is arranged below the molded body, and the first contact layer of the semiconductor chip. The further contact point can be a circuit board, a metal plate or a contact material. Furthermore, due to the thickness of the molded body, a sufficient mechanical stability of the optoelectronic semiconductor component is generated, wherein the optoelectronic semiconductor component achieves a high breaking strength, in particular along the semiconductor chip edges and at the transition to the molded body.

According to at least one embodiment, the molded body is at least formed from a mechanically stabilizing, non-conductive molding material and a conductive filler.

According to at least one embodiment, the non-conductive molding material is selected from a group including epoxy resin, silicone, epoxy silicone hybrid, polyamide 6, glass and glass ceramics. The molded body covers in particular all side surfaces and the lower surface of the optoelectronic semiconductor chip. In other words, the at least one optoelectronic semiconductor chip is encapsulated by the molded body. Recasting (also called as enmolding) or encapsulating can be effected by means of spraying, casting, printing, laminating a foil or the like, for example. The molded body can be formed from a mechanically stabilizing material such as plastic, a low-melting glass or a low-melting glass-ceramics. In particular, the mechanically stabilizing molding material is non-conductive and thus does not serve to provide an electric contact. If this is the case, only the conductive filler serves to provide an electric contact.

According to at least one embodiment, a conductive filler is embedded in the stabilizing non-conductive molding material. In particular, the conductive filler comprises a material of aluminum, gold, silver, copper, tin, carbon, or combinations thereof.

In particular, copper, in particular copper fibers with a low-melting metal is used as conductive filler. In particular, the low-melting metal is a tin alloy. In particular, the non-conductive molding material is a polyamide 6. In particular, SCHULATEC® TinCo from Schulman GmbH is used as the conductive filler. SCHULATEC® TinCo is a material that comprises a polyamide 6 as molding material, with copper fibers and a low-melting tin alloy being added thereto.

According to at least one embodiment, the conductive filler is formed as a particle or nanotube and embedded in the non-conductive molding material. In particular, the conductive filler is formed from aluminum flakes, carbon black and/or carbon nanotubes.

In this case, aluminum flakes can be particles, wherein the individual particles have a predominantly different external appearance.

In this case, carbon black relates to a black powder-type solid material, which, depending on quality and use, consists of 80 to 99.5% carbon.

The term carbon nanotubes relates to microscopically small tubular objects of carbon. Their walls in particular consist only of carbon, wherein the carbon atoms take a comb-like structure with hexagons and in each case three binding partners ($sp^2$ hybridization). In particular, the carbon nanotubes have a diameter in the range of 1 to 50 nm, e.g. 5 nm. The length of the carbon nanotubes can be from multiple millimeters to 20 cm for carbon nano bundles. The use of conductive fillers as particles or nanotubes in a non-conductive molding material of the molded body leads to an electric contacting of the optoelectronic semiconductor chip.

Thus, a direct contacting of the semiconductor chip with e.g. one further contact point at the bottom side of the optoelectronic semiconductor chip is not required. Moreover, the thickness of the component is increased by the conductive molded body compared to an optoelectronic semiconductor component that does not comprise a conductive molded body. As a result, a semiconductor component which has a higher mechanical stability and/or is self-supporting can be generated.

According to at least one embodiment, the conductive filler is homogenously embedded in the stabilizing non-conductive molding material. As a result, a uniform thermal and/or electric conductivity can be generated.

Alternatively, the conductive filler can be embedded in the stabilizing non-conductive molding material with a concentration gradient. Thus, an increased heat dissipation can be effected e.g. in regions that have an increased heat generation by increasing the concentration of the conductive filler in this region.

During production, the molded body is applied on to a carrier in such a way that it at least partially covers the surface of the carrier and is in direct contact with this surface. In particular, the surface of the carrier that does not have any contact with the semiconductor chip and/or the VIA and/or the insulation element is covered. Furthermore, the molded body is at least in places in direct contact with the side surfaces, which e.g. extend transversely or perpendicular to the surface of the carrier, and the bottom side. It is possible that all side surfaces of the at least one semiconductor chip are completely covered by the molded body. In particular, the lower side of the optoelectronic semiconductor chip is covered by the molded body. However, it is also possible that the semiconductor chip is embedded in the molded body only to a certain height and regions of the at least one semiconductor chip extend from the molded body so that the side surfaces of the at least optoelectronic semiconductor chip are free of the molded body at least in places. Moreover, it is also possible that the molded body completely covers the semiconductor chip on its exposed surfaces at least during production.

The inventor has found that the overall thickness of the optoelectronic semiconductor component can be significantly increased, in particular during the production, by the use of a conductive molded body. Furthermore, there is no longer a need to grind all the way down to the semiconductor chip in order to establish a contact to the chip. In this case, the optoelectronic semiconductor chip is covered by the molded body from all side surfaces, i.e. all four side surfaces, and additionally the lower side. In particular, covering is effected by direct mechanical and/or electric contact.

According to at least one embodiment, the optoelectronic semiconductor component comprises a VIA. The VIA includes an electrically conductive material. Here, the VIA is arranged to be laterally spaced from the assigned semiconductor chip. In other words, a VIA is generated at a distance to the semiconductor chip in a direction, which extends e.g. parallel to the surface of a carrier assigned to the semiconductor chip. The VIA completely reaches through the molded body and extends from an upper side of the molded body to a lower side of the molded body. This means that the VIA is freely accessible at least on a lower side of the molded body. In addition, the VIA can be covered by a luminescent layer on the upper side of the molded body.

Prior to recasting the molded body, the VIA can be generated e.g. by means of contact pins, which are arranged on the upper side of the carrier between the semiconductor chip prior to the process of recasting. In this case, the contact pins are formed of an electrically conductive material such as copper. In this case, the contact pins can also be formed integrally with the carrier, which means that a substrate with existing VIAs is used as the carrier. Furthermore, the carrier can be a lead frame.

As an alternative, it is possible that the VIA is generated by the generation of recesses in the molded body after recasting the semiconductor chip. For example, holes that completely reach through the molded body and extend from its upper side to its lower side can be generated by laser drilling or other types of material removal. These holes are filled with a conductive material then. The conductive material can be an electroplating, a solder material or a conductive adhesive. As an alternative or in addition, the conductive material may have an additional metallization. In particular, the metallization is arranged on the surface of the conductive material. In particular, the metallization completely encapsulates the VIA.

According to at least one embodiment, the optoelectronic semiconductor component comprises an insulating element. In a lateral view, the insulating material is arranged at least within the molded body at least between the VIA and the semiconductor chip. In particular, the insulation element extends from the upper side of the molded body to the lower side of the molded body. In this case, the insulating element in particular completely reaches through, respectively penetrates the molded body.

The insulation element can be freely accessible at least at the lower side of the molded body. The insulating element can be covered by a luminescent layer at the upper side of the molded body.

According to at least one embodiment, the insulating element is adapted to prevent a direct current flow between the semiconductor chip and the VIA. In particular, this means that no direct current flows between the VIA through the molded body to the semiconductor chip and vice versa. The current flow is effected via an electrically conductive connection, which is electrically conductively connected with the semiconductor chip and the VIA. In particular, the electrically conductive connection is electrically conductively connected to the upper side of the semiconductor chip and extends along the upper side of the molded body. The electrically conductive connection is in electrically conductive contact with e.g. a bond wire at the upper side of the assigned semiconductor chip and extends all the way to the VIA. The electrically conductive connection extends on the upper side of the molded body either on the external side of the molded body or closely below the external side of the molded body. The electrically conductive connection can be generated by means of sputtering, photolithography, electroplating and/or reverse etching. Furthermore, it is possible to print-on an insulating material and metal for generating the electrically conductive connection. This can be effected by means of a sintering process. Thus, it is also possible e.g. that the electrically conductive connection is applied by means of an injection-molding process. In other words, the electrically conductive connection is applied in the type of a "molded interconnected device" (MID; German: "spritzgegossener Schaltungsträger".

The generation of VIAs and assigned electrically conductive connections is advantageous when the optoelectronic semiconductor chips comprise contact points on their upper side and the lower side facing away from the upper side. As an alternative, the use of flip-chip semiconductor chips is possible, which comprise electrical contact points only at one side, either the lower side or the upper side. In this case, the VIA through the molded body can be omitted.

According to at least one embodiment, the insulation element covers at least the side surfaces of the VIA directly, i.e. in direct mechanical and/or electric contact. The insulation element prevents a direct current flow between the semiconductor chip and the VIA, in particular within the molded body.

According to at least one embodiment, the insulation element is spaced from the side surfaces of the VIA and from the side surfaces of the semiconductor chip, in particular laterally. In particular, the insulation element extends at least from the upper side to the lower side of the molded body. The insulation element prevents a direct current flow between the semiconductor chip and the VIA. In other words, the insulation element forms an electrically insulating barrier between the VIA and the optoelectronic semiconductor chip within the molded body. As a result, a direct current flow, i.e. a current flow between semiconductor chip and VIA, via the molded body is prevented.

Furthermore, a method for producing an optoelectronic semiconductor component is provided. The method for producing an optoelectronic semiconductor component preferably produces an optoelectronic semiconductor component described herein. In other words, all features disclosed for the method are also disclosed for the optoelectronic semiconductor component and vice versa.

According to at least one embodiment, the method comprises the following steps:
A) Providing a carrier,
B) Arranging at least one optoelectronic semiconductor chip on an upper side of the carrier,
C) Recasting the at least one optoelectronic semiconductor chip with a molded body, wherein the molded body at least partially covers all side surfaces and the lower side of the at least one optoelectronic semiconductor chip and the molded body is electrically conductive and configured to electrically contact the at least one optoelectronic semiconductor chip. In particular, the upper side and/or the lower side of the at least one semiconductor chip is free of the molded body and, in particular, the upper side and/or the lower side are exposed. In particular, the method comprises a step D, removal of the carrier.

According to at least one embodiment of the method, first a carrier is provided. The carrier is a temporary carrier, which is removed in a final method step. The carrier may be e.g. a foil, a circuit board or generally a board, which is formed with a plastic material, a metal, a ceramic material or a semiconductor material.

According to at least one embodiment of the method, at least one optoelectronic semiconductor chip is arranged in an upper side of the carrier on the carrier. The optoelectronic semiconductor chip is an LED chip or a photodiode chip, for example. Furthermore, the optoelectronic semiconductor chip may also be a laser diode chip. The at least one optoelectronic semiconductor chip is attached on the carrier preferably in such a way that a mechanical connection between the optoelectronic semiconductor chip and the carrier results, which can later be released for the optoelectronic semiconductor chip in a non-destructive manner. In other words, a sacrificial layer is arranged between the semiconductor chip and the carrier. The optoelectronic semiconductor chip can be attached on the carrier by means of an adhesive, for example.

Preferably, a plurality of optoelectronic semiconductor chips is attached on the carrier. The arrangement of the carrier and the plurality of optoelectronic semiconductor chips is a so-called artificial wafer then, in which a plurality optoelectronic semiconductor chip, preferably of the same type, are arranged on one common carrier.

According to at least one embodiment of the method, the at least one optoelectronic semiconductor chip, preferably the plurality of optoelectronic semiconductor chips, is molded around by a molded body (step C). In particular, the molded body is at least partially or completely molded around all side surfaces of the at least one optoelectronic semiconductor chip as well as the lower side of the optoelectronic semiconductor chip. In other words, the at least one optoelectronic semiconductor chip can be completely encapsulated by the molded body. In particular all side surfaces, in particular four side surfaces, and the lower side and thus five surfaces are encapsulated by the molded body in a form-fit manner. This recasting or encapsulating can be effected by means of spraying, casting, printing, laminating a foil or the like, for example.

The optoelectronic semiconductor chip is applied on to the carrier in particular in such a way that the main radiation side of the optoelectronic semiconductor chip is in direct, i.e. direct mechanical or electric contact with the carrier.

According to at least one embodiment, the carrier is removed. In other words, the carrier is removed from the composite of molded body and the optoelectronic semiconductor chip after recasting the at least one optoelectronic semiconductor chip. The removal can be effected by heating or thinning the carrier. Furthermore, it is possible that the removal is effected by chemical removal of the carrier or a present adhesive layer. After the removal of the carrier, the lower side of the at least one optoelectronic semiconductor chip originally facing the carrier is freely accessible. The lower side can be the main radiation side of the semiconductor chip, through which radiation emerges during operation of the semiconductor chip. In other words, the semiconductor chip is applied face down on to the carrier.

According to at least one embodiment, a plurality of optoelectronic semiconductor chips is arranged on the upper side of the carrier, wherein each of the semiconductor chips in operation is provided for generating electromagnetic radiation of a wavelength range with a peak wavelength assigned to the semiconductor chip. In other words, each of the semiconductor chips is suitable for generating electromagnetic radiation. In operation, the semiconductor chip generates electromagnetic radiation in a certain wavelength range. The generated electromagnetic radiation has a maximum at a certain wavelength of the peak wavelength in the wavelength range. In other words, the peak wavelength is the dominant wavelength of the electromagnetic radiation generated by the semiconductor chip in operation. Incidentally, the peak wavelength of each of the semiconductor chips may vary from an average value of the peak wavelength of all semiconductor chips by at most +/−2% or +/−1%. In other words, the optoelectronic semiconductor chips are optoelectronic semiconductor chips which emit electromagnetic radiation of the same or similar wavelength (s). In particular, the optoelectronic semiconductor chips are identical in construction.

As an alternative, a plurality of optoelectronic semiconductor chips can be arranged at the upper side of the carrier, wherein each of the semiconductor chips in operation is provided for generating electromagnetic radiation with a different peak wavelength. For example, at least three semiconductor chips can be arranged, which emit electromagnetic radiation from the red, green and blue region (RGB).

According to at least one embodiment, in step C), a molded body having a thickness of at least 200 µm is generated at least below the at least one optoelectronic semiconductor chip.

According to at least one embodiment, at least one VIA with an electrically conductive material is generated for each semiconductor chip before or after recasting. In particular, the VIA is arranged laterally to the assigned semiconductor chip. The VIA extends completely through the molded body at least in the finished component. An insulation element which is arranged laterally spaced from the assigned semiconductor chip and extends completely through the molded body at least in the finished component is arranged between the VIA and the assigned semiconductor chip. The insulation element is arranged within the molded body. In other words, the insulation element is embedded by the molded body and extends from the upper side to the lower side of the molded body in the finished optoelectronic semiconductor component. During the production, it is also possible that the insulation element does not completely extend through the molded body. For example, the insulation element extends no farther than two thirds of the height of the molded body.

In a subsequent method process, the molded body can be ground. The molded body is ground to a level that the at least one VIA and/or the insulation element extends from the upper side of the molded body to a lower side of the molded body. In other words, the molded body and/or the insulation element are ground in such a way that they have the height of the molded body in this region. An electrically conductive connection between the VIA and the assigned semiconductor chip is produced. The electrically conductive connection is electrically-conductively connected with the surface facing away from the carrier on the upper side of the semiconductor chip and extends at the upper side of the molded body.

The inventor has found that, by the use of a conductive molded body, the optoelectronic semiconductor chip can be completely embedded in the molded body, i.e. with its side surfaces and the lower surface in the molded body, so that only the main radiation side is free of the molded body. In particular, the electric molded body is used for contacting. Furthermore, the molded body includes an insulation element, which is embedded in the molded body. In particular, the insulation element is arranged between the anode and the cathode. As a result, in particular the predetermined breaking points along the semiconductor chip edges can be prevented and a mainly contiguous base for an optoelectronic semiconductor component can be produced. In particular, strongly bent wafers will no longer be produced, the generated semiconductor components can be easily handled and are also very break-proof. Furthermore, the singulated optoelectronic semiconductor components can be easily handled in a so-called pick-and-place process. Furthermore, there is no need to grind to the level of the semiconductor chip in order to contact the semiconductor chip, as is known from the prior art.

According to at least one embodiment, SCHULATEC® TinCo is used as molded body and Ti, Pt and/or gold is used as electrically conductive connection and/or contact points.

The inventor has found that the thickness of the component can significantly be increased by the use of a conductive molded body and nevertheless a sufficient electric contacting can be achieved. This reduces bents and breaks so that hard additional carriers can be omitted. This saves process costs and material. In addition, optoelectronic semiconductor components with an electrically conductive molded body can be processed in a simple manner and exhibit higher reliability and a very high yield during production.

Further advantages, advantageous embodiments and developments are indicated in the following exemplary embodiments descripted in conjunction with the figures.

Figure 5:
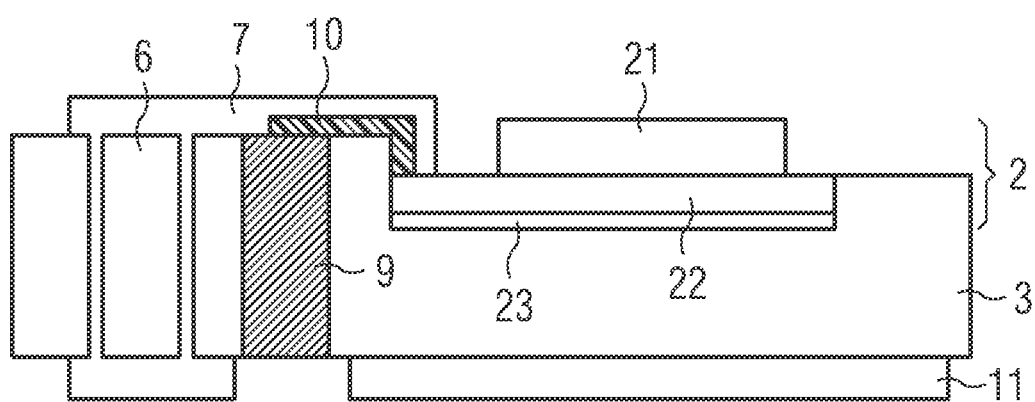
Figure 6:
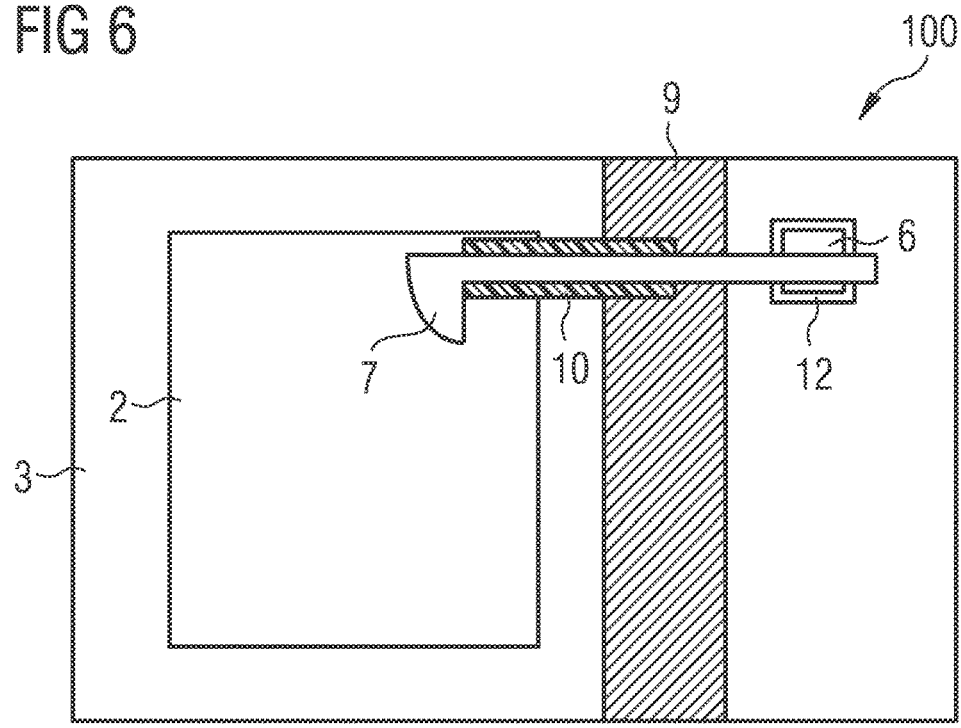
Figure 7:
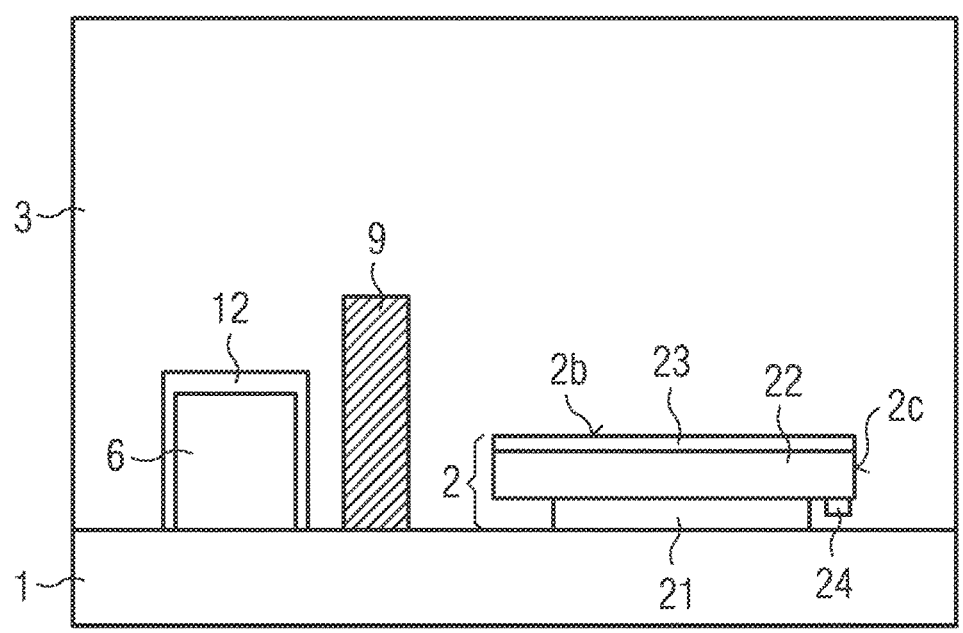

The figures show in:
FIG. 1 schematically a method for producing a VIA according to one embodiment,
FIG. 2 a schematic lateral view of an optoelectronic semiconductor component according to one embodiment,
FIGS. 3A and 3B in each case a schematic plan view of an optoelectronic semiconductor component according to one embodiment,
FIG. 4 a method for producing an optoelectronic semiconductor component according to one embodiment,
FIG. 5 schematically a lateral view of an optoelectronic semiconductor component according to one embodiment,
FIG. 6 schematically a plan view of an optoelectronic semiconductor component according to one embodiment, and
FIG. 7 schematically a method for producing an optoelectronic semiconductor component according to one embodiment.

The same or equivalent elements or elements having the same functions can be indicated with the same reference characters throughout the exemplary embodiments and figures. The illustrated elements and dimensional ratios are not to be understood as made to scale. Individual elements such as layers, components, devices and regions may rather be illustrated exaggerated in size for the purpose of better illustration and/or better understanding.

FIG. 1 shows a schematic illustration of a method for producing at least one VIA 6. FIG. 1A shows the simultaneous production of six VIAs 6 in an exemplary manner, the VIAs including electrically-conductive material. The electrically-conductive material can be a patternable and conductive material, for example a metal, such as gold or silver, or a doped silicon. Patterning can be effected by means of etching processes, for example. Subsequently, a metallization 5 can optionally be effected on to the patterned surface of the electrically-conductive material. Any conductive metal such as gold (FIG. 1B) is suitable as metallization 5, for example. After that, the patterned electrically conductive material can be potted with an insulating element 9 (FIG. 1C). The insulating element 9 can be a silicon dioxide, for example. The insulating element 9 covers the VIA 6 in a form-fit manner. Subsequently, singulation can be effected for generating VIAs 6 covered with the insulating element 9 (FIG. 1D).

Figure 2:
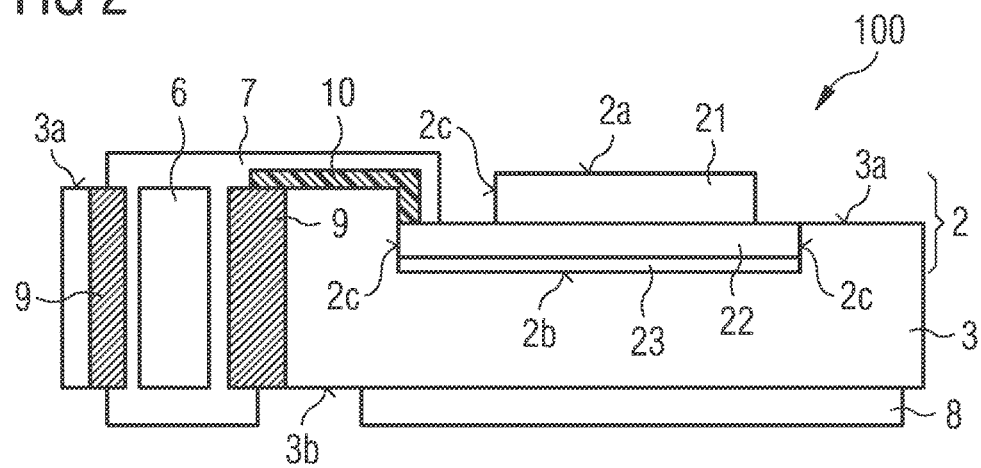

FIG. 2 schematically shows a lateral view of an optoelectronic semiconductor component 100 according to one embodiment. The semiconductor component 100 comprises an optoelectronic semiconductor chip 2. The optoelectronic semiconductor chip 2 comprises side surfaces 2C and a bottom side 2b, which are at least partially covered by a molded body 3. In particular, the semiconductor chip 2 comprises a semiconductor layer sequence 21, a substrate 22 and a first contact layer 23. The first contact layer 23 in particular is an n contact, i.e. an electric contact to at least one n semiconductor layer of the semiconductor layer sequence 21. Furthermore, the semiconductor component 100 may comprise a second contact layer 24, which in particular is configured as a p-contact for contacting at least one p-semiconductor layer of the semiconductor layer sequence 21. In particular, the molded body 3 covers the side surfaces of the substrate 22 and of the first contact layer 23 of the semiconductor chip 2. The molded body 3 is electrically conductive. In particular, the molded body 3 comprises a material of an electrically conductive polymer. In addition, the electrically conductive polymer can also be thermally conductive. In particular, the electrically conductive polymer does not have any constituents of thermoplastic materials. The optoelectronic semiconductor component 100 comprises a VIA 6, which includes an electrically conductive material. The VIA 6 is laterally spaced from the semiconductor chip. FIG. 2 shows that the VIA 6 is embedded in an insulation element 9. The insulation element 9 prevents a direct current flow via the molded body 3 to the semiconductor chip 2. The optoelectronic semiconductor component 100 further comprises an electrically conductive connection 7. The electrically conductive connection 7 connects the semiconductor chip 2 and the VIA 6 with one another in an electrically-conductive manner. An insulating material 10 is applied below the electrically conductive connection 7 for electrically insulating against the electrically conductive molded body 3. The insulating material 10 can be silicon dioxide, for example. Furthermore, the optoelectronic semiconductor component 100 can at least comprise one further contact point 8, which allows for a vertical current flow via the molded body 3 into the semiconductor chip 2. The further contact point 8 can be a circuit board or a metal plate.

Figure 3:
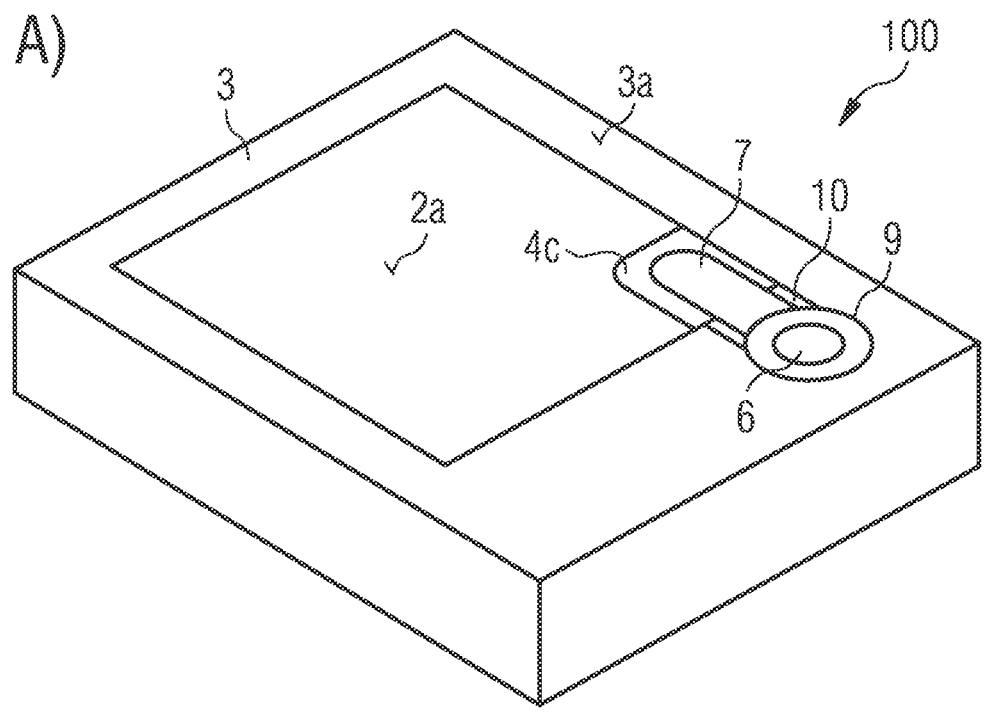
Figure 3:
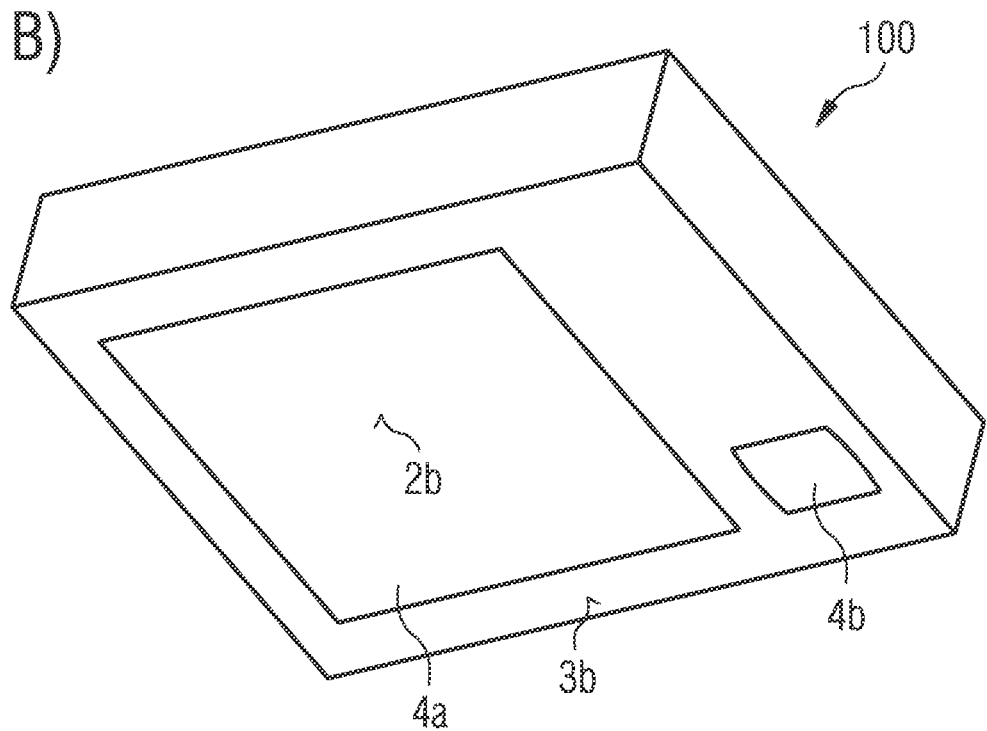

FIGS. 3A and 3B each show views of an optoelectronic semiconductor component 100 described herein in a schematic perspective view. FIG. 3A shows the semiconductor component 100 from the upper side 2a of the semiconductor chip 2. The semiconductor component 100 includes exactly one semiconductor chip 2, which is completely surrounded by the molded body 3 on its side surfaces 2c. A VIA 6 is formed through the molded body 3, which is connected to the contact point 4c at the upper side 2a of the semiconductor chip by means of the electrically conductive connection 7. A contact point 4a is formed on the lower side of the semiconductor component, see FIG. 3B, by means of which the semiconductor chip 2 is contacted e.g. p-side. The n-side contacting is effected by means of the contact point 4b, which is formed by the VIA 6. The molded body 3 is also arranged between the VIA 6 and the semiconductor chip 2.

Furthermore, the optoelectronic semiconductor component 100 comprises an insulation element 9, which electrically insulates the VIA 6 and the semiconductor chip, so that no direct current flow is effected via the electrically conductive molded body 3.

It is possible here that a contact point 4a is located on the upper side 2a and a contact point 4b is located on the lower side 2b. Furthermore, both contact points 4a, 4b can be located on the same side. Furthermore, it is possible that the lower side 2b or the upper side 2a is the radiation side or the main radiation side of the semiconductor chip 2. In other words, the main radiation side of the semiconductor chip 2 can include the side surfaces 2c and the outer surfaces on the upper side 2a and/or of the lower side 2b.

Figure 4:
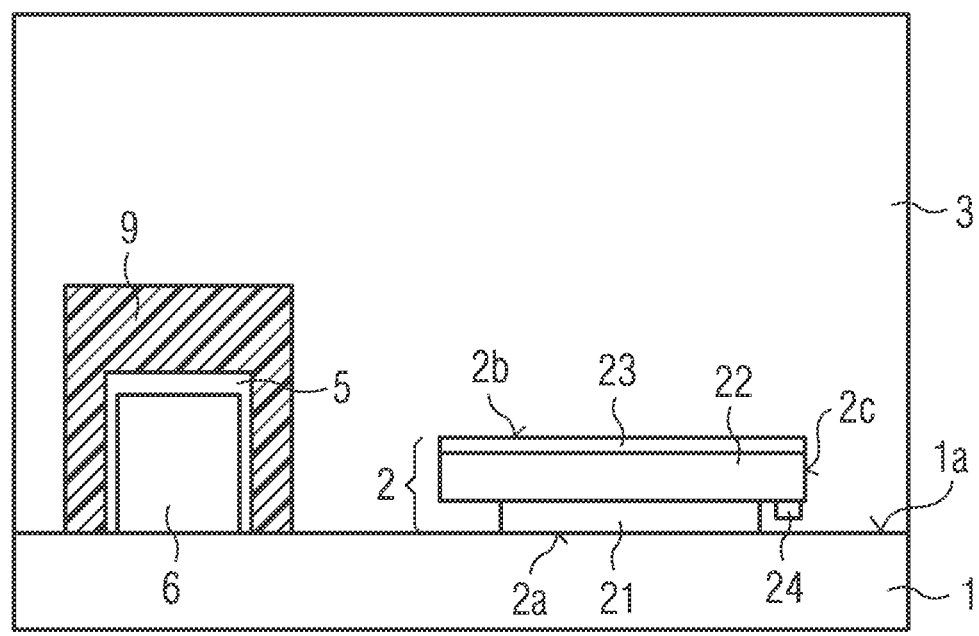

FIG. 4 schematically shows a method for producing an optoelectronic semiconductor component 100 according to one embodiment. A carrier 1 is provided. A semiconductor chip 2 is arranged on this carrier 1. Furthermore, a VIA 6 is applied, which e.g. may additionally comprise a metallization 5. The application is in particular effected by a so-called pick-and-place process. The VIA 6 can be encapsulated by an insulating element 9. The production of a VIA 6 encapsulated with an insulating element 9 is illustrated in FIG. 1. After that, the molded body 3 is molded around the at least one optoelectronic semiconductor chip 2, wherein the molded body covers all side surfaces 2c and the lower side 2b of the at least one optoelectronic semiconductor chip 2 and the molded body 3 is electrically conductive. The molded body 3 is adapted to contact the at least one optoelectronic semiconductor chip 2. After that, the upper side 2a and/or the lower side 2b of the at least one semiconductor chip 2 can be free of the molded body or be exposed. In particular, exposing the upper side 2a of the semiconductor chip 2 is effected by grinding. In this process, the molded body 3 and at least partially the insulating element 9 is ground, in particular to the height of the VIA 6.

Subsequently, the removal of the carrier 1 can be effected. The carrier 1 can be a foil, for example. The removal of the carrier 1 can be effected by stripping the foil. As an alternative, the removal of the carrier can also be effected before recasting with the molded body 3.

Subsequently, an electrically conductive connection 7 can be generated, which is electrically conductively connected to the semiconductor chip 2 and extends on the upper side 3a of the molded body 3.

FIG. 5 schematically shows a side view of an optoelectronic semiconductor component 100 according to one embodiment. The optoelectronic semiconductor component 100 of FIG. 5 is different from the optoelectronic semiconductor component 100 of FIG. 2 in that the insulating element 9 is spaced from the VIA. The insulating element 9 is arranged between the VIA 6 and the semiconductor chip 2. The insulating element 9 is spaced from at least the side surfaces of the VIA 6 and the side surfaces of the semiconductor chip 2. The insulating element 9 does not allow for any direct current flow between the semiconductor chip 2 and the VIA 6. The current flow is effected from the semiconductor chip 2 to the VIA 6 via the electrically conductive connection 7.

FIG. 6 schematically shows a plan view of an optoelectronic semiconductor component 100 according to one embodiment. The VIA 6 can be encapsulated by means of a metallization 12 to generate a better electric conductivity. The insulating element 9 extends through the molded body 3 particularly in the plan view. In particular, the insulating element 9 extends from the upper side 3a of the molded body 3 to the lower side 3b of the molded body 3 (not shown here). Thus, the insulating element 9 can prevent a direct current flow via the electrically-conductive molded body 3 from the VIA 6 and the semiconductor chip 2 or vice versa.

FIG. 7 schematically shows a method for producing an optoelectronic semiconductor component 100 according to one embodiment. The method of FIG. 7 is different from the method of FIG. 4 in that here the insulating element 9 is not applied together with the VIA 6 on to the carrier 1, but in separate steps. In particular, at least the insulating element 9 and the VIA 6 can be applied on to the carrier 1 at the same time. Furthermore, the semiconductor chip 2 can be placed on to the carrier 1 by means of a pick-and-place process. Thus, three elements are arranged on the carrier 1 by means of a pick-and-place process. After that, the molded body 3 is molded around the three elements 6, 9 and 2. In particular, the molded body 3 is electrically conductive and/or thermally conductive. After the process of recasting, the carrier 1 can be removed.

Then, the molded body 3 can be ground all the way down to the VIA 6. Here, the VIA 6 extends from the upper side 3a of the molded body 3 to the lower side 3b of the molded body 3. Further method steps can be performed in analogy to the method of FIG. 4.

The exemplary embodiments described in conjunction with the Figures and their features can also be combined according to further exemplary embodiments, even if such features are not explicitly shown in the Figures. Furthermore, the exemplary embodiments described in conjunction with the Figures may comprise additional or alternative features according to the description of the general section.

The invention is not limited to the description by the description by means of the exemplary embodiments. The invention rather comprises any new feature as well as any combination of features in the claims, even if said feature or said combination per se is not explicitly indicated in the claims and the exemplary embodiments.

This patent application claims the priority of the German Patent Application 10 2015 107 591.1, the disclosure of which is hereby incorporated by reference.

LIST OF REFERENCE CHARACTERS

1 carrier
2a upper side of the carrier 2 optoelectronic semiconductor chip
21 semiconductor layer sequence
22 substrate
23 first contact layer (n contact)
24 second contact layer (p contact)
2a upper side of the optoelectronic semiconductor chip
2b lower side of the optoelectronic semiconductor chip
2c side surfaces of the optoelectronic semiconductor chip
3 molded body
31 molding material of the molded body
32 conductive filler of the molded body
3a upper side of the molded body
3b lower side of the molded body
4 contact points
5 metallization
6 VIA
7 electrically conductive connection
8 further contact points
9 insulating element
10 insulating material

The invention claimed is:

1. An optoelectronic semiconductor component having an optoelectronic semiconductor chip, the side surfaces and lower side of which are at least partially covered by a molded body,
wherein the molded body is electrically conductive and configured to electrically contact the optoelectronic semiconductor chip,
at least one VIA, which includes an electrically conductive material and is arranged laterally spaced to the semiconductor chip,
wherein the VIA completely extends through the molded body, wherein the VIA extends from an upper side of the molded body to a lower side of the molded body,
at least one insulating element, which is arranged between the VIA and the semiconductor chip within the molded body and extends from the upper side of the molded body to the lower side of the molded body,
an electrically conductive connection, which is electrically conductively connected to the semiconductor chip and the VIA.

2. The optoelectronic semiconductor component according to claim 1, wherein the molded body is additionally thermally conductive.

3. The optoelectronic semiconductor chip according to claim 1, wherein the molded body is formed of a conductive polymer.

4. The optoelectronic semiconductor component according to claim 3, wherein the conductive polymer is selected from a group including polypyrrole, polythiophene and polyaniline.

5. The optoelectronic semiconductor component according to claim 3, wherein the conductive polymer is free of thermoplastic properties.

6. The optoelectronic semiconductor component according to claim 1, wherein the molded body, at least below the semiconductor chip, is formed with a uniform thickness, which is at least 200 μm and wherein a current flow through the molded body is effected at least below the semiconductor chip.

7. The optoelectronic semiconductor component according to claim 1, wherein the molded body is formed at least of a mechanically stabilizing, non-conductive molding material and a conductive filler.

8. The optoelectronic semiconductor component according to claim 7, wherein the conductive filler comprises a material made of aluminum, gold, silver, copper, tin, carbon, or combinations thereof.

9. The optoelectronic semiconductor component according to claim 7, wherein the conductive filler is formed as particles or nanotubes and is embedded in the non-conductive molding material.

10. The optoelectronic semiconductor component according to claim 7, wherein the non-conductive molding material is selected from a group including epoxy resin, silicone, epoxy silicone hybrid, polyamide 6, glass and glass ceramics.

11. The optoelectronic semiconductor component according to claim 1, wherein the insulating element directly covers at least the side surfaces of the VIA, wherein the insulating element prevents a direct current flow between the semiconductor chip and the VIA.

12. The optoelectronic semiconductor component according to claim 1, wherein the insulating element is spaced from at least the side surfaces of the VIA and the side surfaces of the semiconductor chip and wherein the insulating element prevents a direct current flow between the semiconductor chip and the VIA.

13. A method for producing an optoelectronic semiconductor component, comprising the following steps:
A) providing a carrier,
B) arranging at least one optoelectronic semiconductor chip on an upper side of the carrier,
C) recasting the at least one optoelectronic semiconductor chip with a molded body, wherein the molded body at least partially covers all side surfaces and the lower side of the at least one optoelectronic semiconductor chip and the molded body is electrically conductive and configured to electrically contact the at least one optoelectronic semiconductor chip, wherein the upper side or the lower side of the at least one semiconductor chip remains free of the molded body or is exposed, and
D) removing the carrier,
wherein:
before or after the process of recasting, at least one VIA with an electrically-conductive material is generated for each semiconductor chip,
the VIA is arranged laterally spaced from the assigned semiconductor chip,
the VIA completely extends through the molded body,
an insulation element is arranged between the VIA and the assigned semiconductor chip and within the molded body, which insulation element is arranged laterally spaced from the assigned semiconductor chip and completely extends through the molded body, and
an electrically-conductive connection, which is electrically-conductively connected to the semiconductor chip and extends on the upper side of the molded body, is generated between the VIA and the assigned semiconductor chip.

14. The method according to claim 13, wherein in step C) a molded body, which has a thickness of at least 200 μm, is generated at least below the at least one optoelectronic semiconductor chip.

15. An optoelectronic semiconductor component having an optoelectronic semiconductor chip, the side surfaces and lower side of which are at least partially covered by a molded body, wherein the molded body is electrically conductive and configured to electrically contact the optoelectronic semiconductor chip, at least one VIA, which includes an electrically conductive material and is arranged laterally spaced to the semiconductor chip, wherein the VIA completely extends through the molded body, wherein the VIA extends from an upper side of the molded body to a lower side of the molded body, at least one insulating element, which is arranged between the VIA and the semiconductor chip within the molded body and extends from the upper side of the molded body to the lower side of the molded body, an electrically conductive connection, which is electrically conductively connected to the semiconductor chip and the VIA, wherein the insulating element is spaced from at least the side surfaces of the VIA and the side surfaces of the semiconductor chip and wherein the insulating element prevents a direct current flow between the semiconductor chip and the VIA.

\* \* \* \* \*